(12) United States Patent
Horiuchi et al.

(10) Patent No.: US 12,259,549 B2
(45) Date of Patent: *Mar. 25, 2025

(54) VEHICLE INCLUDING A VIRTUAL IMAGE OPTICAL SYSTEM IN A HOUSING HAVING HEAT DISSIPATION

(71) Applicant: Maxell, Ltd., Kyoto (JP)

(72) Inventors: Go Horiuchi, Kyoto (JP); Akio Misawa, Kyoto (JP)

(73) Assignee: MAXELL, LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/595,494

(22) Filed: Mar. 5, 2024

(65) Prior Publication Data

US 2024/0201492 A1    Jun. 20, 2024

Related U.S. Application Data

(63) Continuation of application No. 17/428,994, filed as application No. PCT/JP2019/039845 on Oct. 9, 2019, now Pat. No. 11,953,681.

(30) Foreign Application Priority Data

Feb. 22, 2019   (JP) .................... 2019-030786

(51) Int. Cl.
*G02B 27/01* (2006.01)
*B60K 35/00* (2024.01)
(Continued)

(52) U.S. Cl.
CPC .......... *G02B 27/0101* (2013.01); *B60K 35/00* (2013.01); *B60R 11/0235* (2013.01);
(Continued)

(58) Field of Classification Search
CPC ............ G02B 27/0101; G02B 27/0149; B60K 35/00; B60K 2370/1529; B60R 11/0235;
(Continued)

(56) References Cited

U.S. PATENT DOCUMENTS 11,953,681 B2 * 4/2024 Horiuchi ............... G03B 21/28
2017/0329181 A1  11/2017 Pierre
(Continued)

FOREIGN PATENT DOCUMENTS

JP    H02-138796 A    5/1990
JP    H07-30280 A     1/1995
(Continued)

OTHER PUBLICATIONS

International Search Report and Written Opinion mailed on Nov. 26, 2019, received for PCT Application PCT/JP2019/039845, Filed on Oct. 9, 2019, 6 pages including English Translation.
(Continued)

*Primary Examiner* — Tracie Y Green
(74) *Attorney, Agent, or Firm* — XSENSUS LLP

(57) ABSTRACT

A vehicle includes a windshield, a display panel, a virtual image optical system forming an optical path of an image light emitted from the display panel onto the windshield, an outer housing, and a control circuit to control the display panel. The outer housing includes an outer case accommodating the virtual image optical system and having the image display panel attached thereto, an upper cover from which the image light is emitted, and a bottom cover covering a bottom portion of the outer case and having fins on an outer surface thereof. The bottom cover accommodates the display panel and the bottom surface of the outer case when fixed to the outer case and the display panel to isolate them from an external space of the outer housing. A heat conduc-
(Continued)

tive portion having a thermal conductivity higher than that of air is between the control circuit and the bottom cover.

19 Claims, 10 Drawing Sheets

(51) Int. Cl.
  *B60R 11/00* (2006.01)
  *B60R 11/02* (2006.01)
  *G02F 1/00* (2006.01)
  *G02F 1/13357* (2006.01)

(52) U.S. Cl.
  CPC ...... *G02F 1/0045* (2013.01); *G02F 1/133603* (2013.01); *B60R 2011/0005* (2013.01); *B60R 2011/0042* (2013.01)

(58) Field of Classification Search
  CPC ............. G02F 1/0045; G02F 1/133603; G02F 1/133385; G03B 21/16; H05K 7/14; H05K 7/20
  See application file for complete search history.

(56) References Cited

U.S. PATENT DOCUMENTS

| | | | |
|---|---|---|---|
| 2020/0285054 A1 | 9/2020 | Fukushima et al. |
| 2020/0387030 A1 | 12/2020 | Barate |
| 2022/0179259 A1 | 6/2022 | Kawawa et al. |

FOREIGN PATENT DOCUMENTS

| | | | |
|---|---|---|---|
| JP | 2006-165052 A | 6/2006 |
| JP | 2007-180141 A | 7/2007 |
| JP | 2016-139707 A | 8/2016 |
| JP | 2017-130514 A | 7/2017 |
| JP | 2017-537354 A | 12/2017 |
| JP | 2018-036379 A | 3/2018 |
| WO | 2005/064577 A1 | 7/2005 |

OTHER PUBLICATIONS

Japanese Office Action issued Oct. 4, 2022 in corresponding Japanese Patent Application No. 2019-030786 (with machine-generated English translation), 8 pages.

Japanese Notice of Reasons for Refusal issued Apr. 28, 2022, in Japanese Application No. 2019-030786.

* cited by examiner

VEHICLE INCLUDING A VIRTUAL IMAGE OPTICAL SYSTEM IN A HOUSING HAVING HEAT DISSIPATION

CROSS-REFERENCE TO RELATED APPLICATIONS

The present application is a continuation application of U.S. Ser. No. 17/428,994, filed Aug. 6, 2021, allowed, which is based on PCT filing PCT/JP2019/039845, filed Oct. 9, 2019, which claims priority to JP 2019-030786, filed Feb. 22, 2019, the entire contents of each are incorporated herein by reference.

TECHNICAL FIELD

The present invention relates to a head up display.

BACKGROUND ART

In a vehicle such as an automobile, generally, information such as vehicle speed and engine speed is displayed on an instrument panel within a dashboard. A screen of a car navigation system or the like is displayed on a display incorporated in the dashboard or installed on the dashboard. As a technique for reducing driver's behavior of largely moving his or her line of sight at the time of visually recognizing the information thereon, there has been known a head up display (Head Up Display, it may be referred to as "HUD" in the following) that projects information such as vehicle speed and car navigation instructions onto a windshield or the like to display a virtual image thereon.

When a temperature of an HUD becomes high under the influence of sunlight, optical components and a liquid crystal panel (LCD) accommodated in a housing of the HUD rises above a heat resistant temperature, and a possibility of damage there on increases. With this regard, as a technique for improving heat resistance of a display device provided in an HUD, Patent Literature 1 discloses "a display unit comprises: a display member including a display surface that emits display light corresponding to an image; a heat storage member having a thermal conductivity that is arranged at a position on the display surface of the display member not blocking the display light passing through a display area; and a thermally conductive adhesion layer that is provided between the display member and heat storage member and composed of a thermally conductive adhesive" (excerpted from Abstract).

CITATION LIST

Patent Literature

Patent Literature 1: JP-A-2018-36379

SUMMARY OF INVENTION

Technical Problem

A housing of the HUD accommodates optical components such as a lens, a liquid crystal panel, and an LED serving as a backlight. In order to prevent accumulation of heat generated from sunlight and the LED and avoid damage on the optical components which may occur due to the accumulation of heat, it can be considered to form an air vent for outside air on a wall of the housing. However, there is a concern that, due to the air vent, dust will float on the optical path and adhere to the optical components.

In addition, since the HUD needs to be accommodated in a limited space within a dashboard, the size of the HUD is limited. Accordingly, in practical application of the HUD, there has been a demand to reduce the size of a body of the HUD while improving the heat dissipation performance and dust proof performance. However, Patent Literature 1 only aims to improve the heat resistance of a display surface of an LCD, and thus cannot satisfy the demand mentioned above.

The present invention has been made in terms of the above, and an object thereof is to provide an HUD that pursues performance required at the time of implementation thereof, which includes reduction in size in addition to improvement of heat dissipation and dust proof.

Solution to Problem

In order to solve the problems above, the present invention includes the technical features described in the scope of claims. As one aspect of the present invention, provided is a head up display for displaying a virtual image to a driver, the head up display comprising: an image display device that includes a backlight and a liquid crystal panel; a virtual image optical system that forms an optical path of an image light emitted from the liquid crystal panel; and an outer housing that accommodates the image display device and the virtual image optical system, the outer housing including: an outer case, to which the image display device is to be mounted, that accommodates the virtual image optical system; an upper cover that covers an upper portion, through which the image light is emitted, of the outer case; and a bottom cover that covers a bottom portion of the outer case, and the bottom cover being formed to: in a state of being fixed to the outer case, accommodate a bottom surface of the outer case and the image display device so as to isolate the bottom surface of the outer case and the image display device from an external space of the outer housing; and include fins on an outer surface thereof.

Advantageous Effects of Invention

According to the present invention, it is possible to provide an HUD that pursues performance required at the time of implementation thereof, which includes reduction in size in addition to improvement of heat dissipation and dust proof. The objects, configurations, and effects other than those described above will be clarified by explanation of the embodiments below.

DESCRIPTION OF EMBODIMENTS

Hereinafter, an embodiment of the present invention will be described with reference to the drawings. Throughout the drawings, basically, the same members are provided with the same reference signs, and repetitive explanation therefor will be omitted. On the other hand, there are cases where a portion provided with a reference sign in a drawing is referred in other drawings with the same reference sign without being illustrated therein again. Furthermore, in the following embodiment, an example in which a head up display (HUD) is installed in a vehicle such as an automobile will be described, meanwhile, the present invention is also applicable to other vehicles such as trains and aircrafts. In addition, the present invention is also applicable to an HUD used for a purpose other than vehicles.

Figure 1:
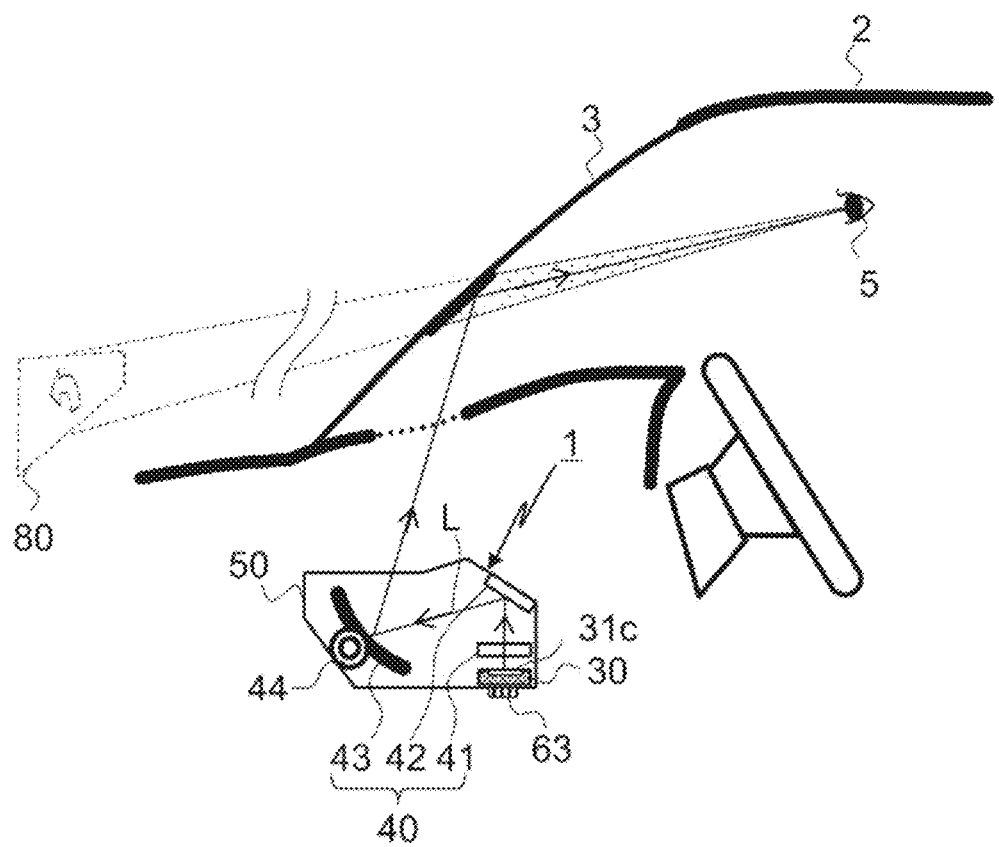
FIG. 1 is a schematic configuration view of a head up display.
Figure 2:
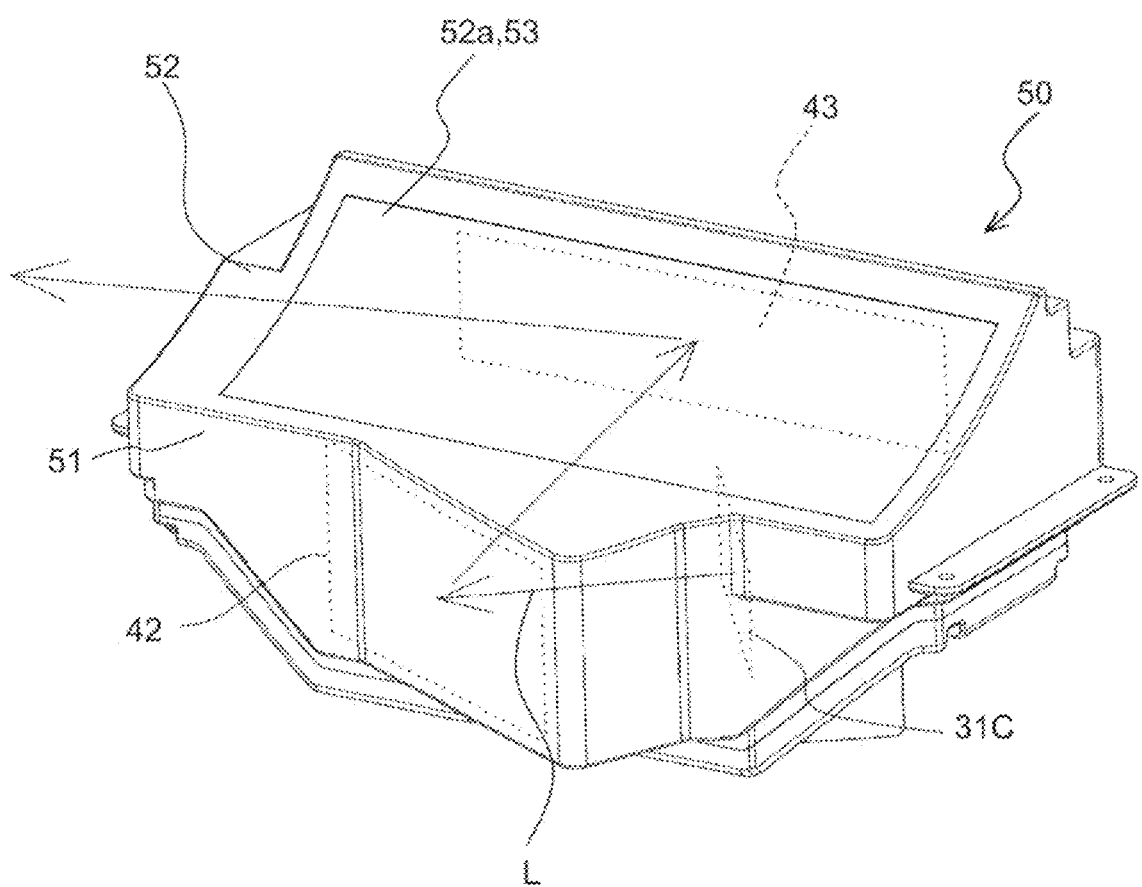
FIG. 2 is a perspective view illustrating an optical path in an outer housing of an HUD.

FIG. 1 is a schematic configuration view of a head up display (HUD) 1 according to the present embodiment. FIG. 2 is a perspective view illustrating an optical path L in an outer housing 50 of the HUD 1 by using arrows.

As illustrated in FIG. 1, the HUD 1 is provided with an image display device 30 and optical components forming a virtual image optical system 40. The image display device 30 includes a Liquid Crystal Display (LCD) panel 31c. The optical components forming a virtual image optical system 40 includes a lens unit 41 for enlarging an image light emitted from the image display device 30, a reflecting mirror 42 for turning back the optical path L, and a concave mirror 43 for enlarging and projecting image information included in the image light. In addition, the HUD 1 is provided with a mirror drive unit 44 that rotates and drives the concave mirror 43, and the outer housing 50 that accommodates the optical components, the mirror drive unit 44, and the image display device 30. Fins 63 are formed on an outer surface of the outer housing 50.

The concave mirror 43 is rotated by the mirror drive unit 44, thereby changing an angle for reflecting the image light toward a wind shield 3. The image light is reflected by the concave mirror 43, and then projected on the windshield 3 of a vehicle 2. The eye of the driver 5 receives the image light projected on the wind shield 3, which causes the driver 5 to visually recognize a virtual image 80 in front of the vehicle 2.

A projection target member is not limited to the wind shield 3 as long as being able to receive the image light projection, and it may be such as a combiner.

The lens unit 41 is a lens group for adjusting an optical distance of the optical path L, or correcting distortion of a display object image included in the image light.

Along an emission direction of the image light from the image display device 30, the lens unit 41, the reflecting mirror 42, and the concave mirror 43 are arranged in order nearest from the image display device 30 to form the virtual image optical system 40, and accommodated in the inside of the outer housing 50.

As illustrated in FIG. 2, the outer housing 50 includes an outer case 51 that accommodates the optical components, an upper cover 52 that covers an upper portion of the outer case 51, and a bottom cover 60 (see FIG. 3) that covers a bottom opening of the outer case 51.

The upper cover 52 has an emission opening 52a through which the image light is emitted. The emission opening 52a is covered with an antiglare plate 53.

The image light emitted from the LCD panel 31c passes through the lens unit 41 (not illustrated in FIG. 2) and turns back its optical path L by the reflecting mirror 42, and travels toward the concave mirror 43. Then, the image light is further reflected by the concave mirror 43, transmits through the antiglare plate 53, and is emitted from the outer housing 50.

By turning back the optical path L in the outer housing 50, it is possible to make the optical path L, which extends from the backlight 31a (see FIG. 6) to the eye of the driver 5, long. The longer the optical path L is, the farther the virtual image 80 is displayed from the driver 5. A viewpoint at which the driver 5 is gazing during driving is generally farther as the traveling speed is faster. In the HUD 1, the optical path L is turned back to make the virtual image distance long, and accordingly, a distance of viewpoint movement that is performed by the driver 5 who is gazing at a far distance during driving so as to visually recognize the virtual image 80 can be made shorter.

Figure 3:
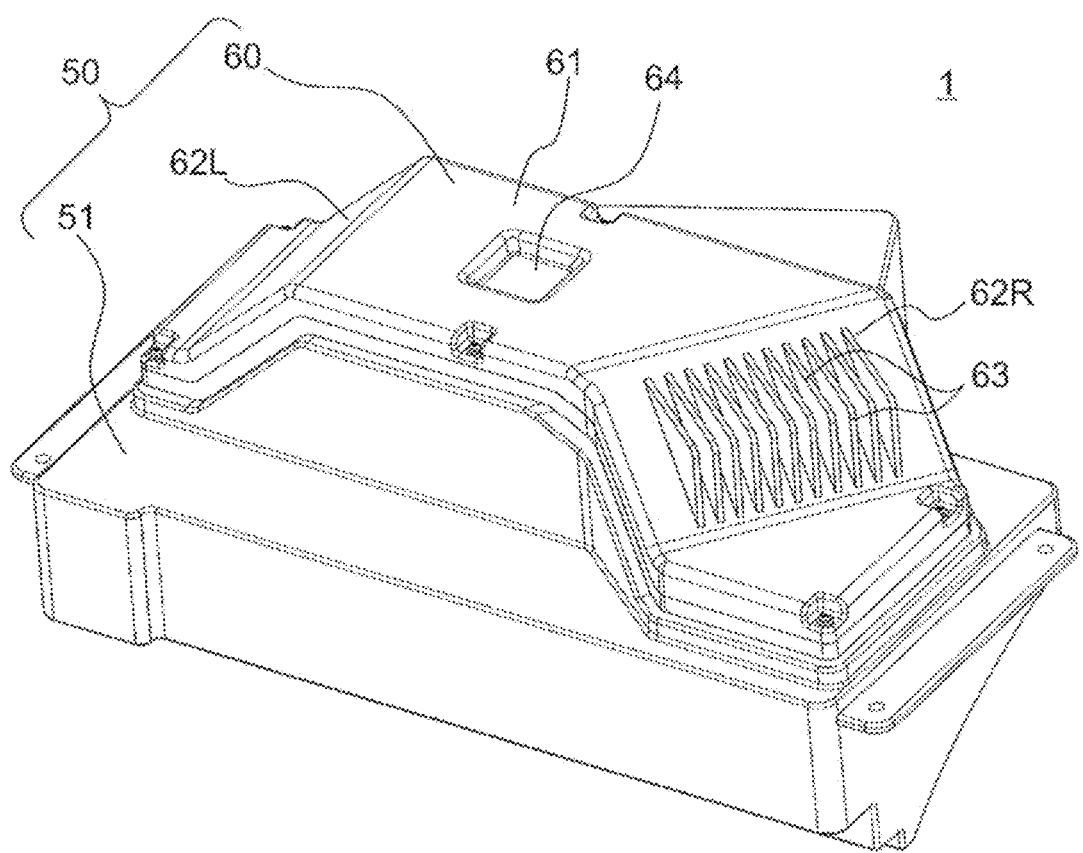
FIG. 3 is a perspective view of a bottom portion of an outer housing.
Figure 4:
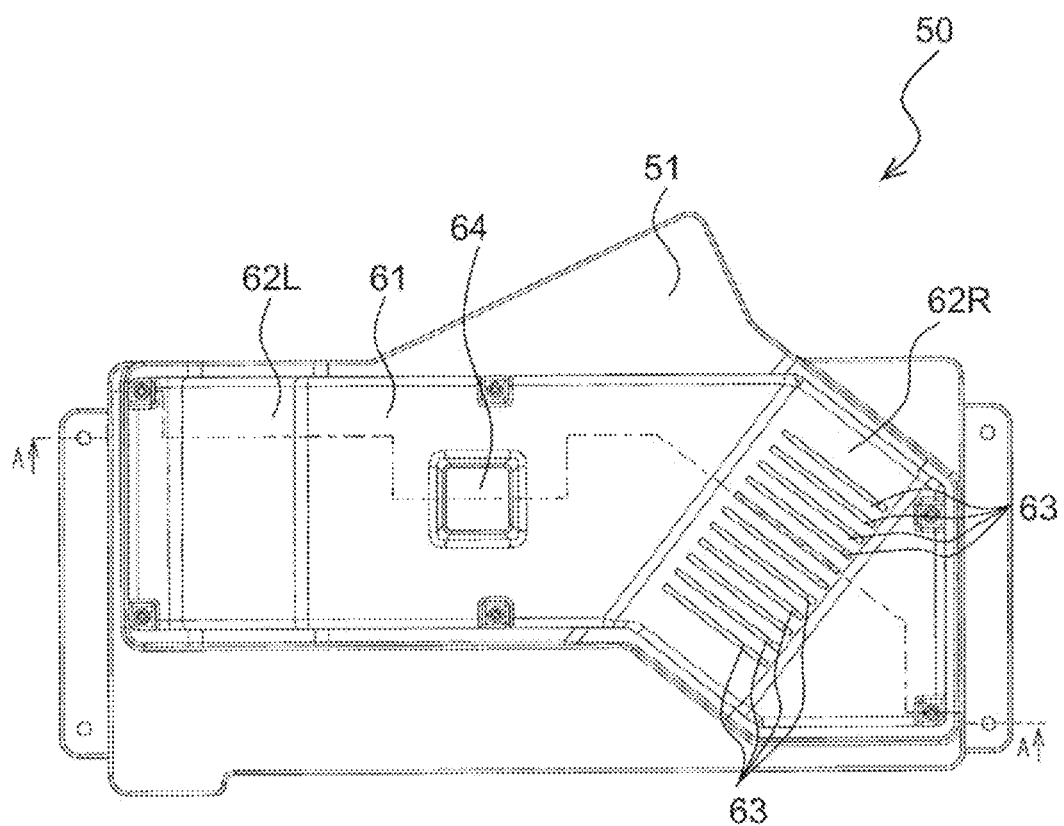
FIG. 4 is a plan view of a bottom portion of an outer housing.
Figure 5:
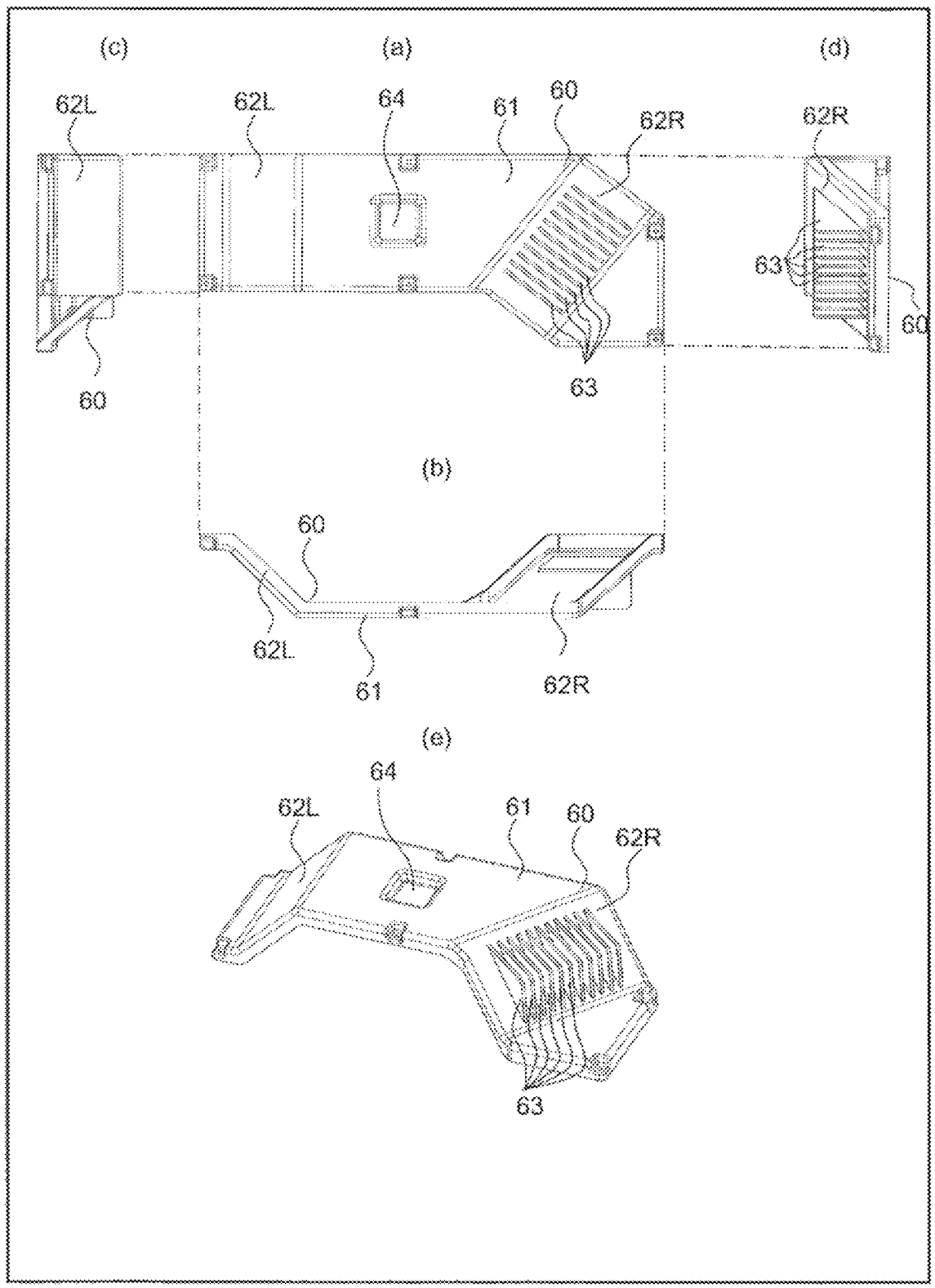
FIG. 5 explains a structure of a bottom cover.
Figure 6:
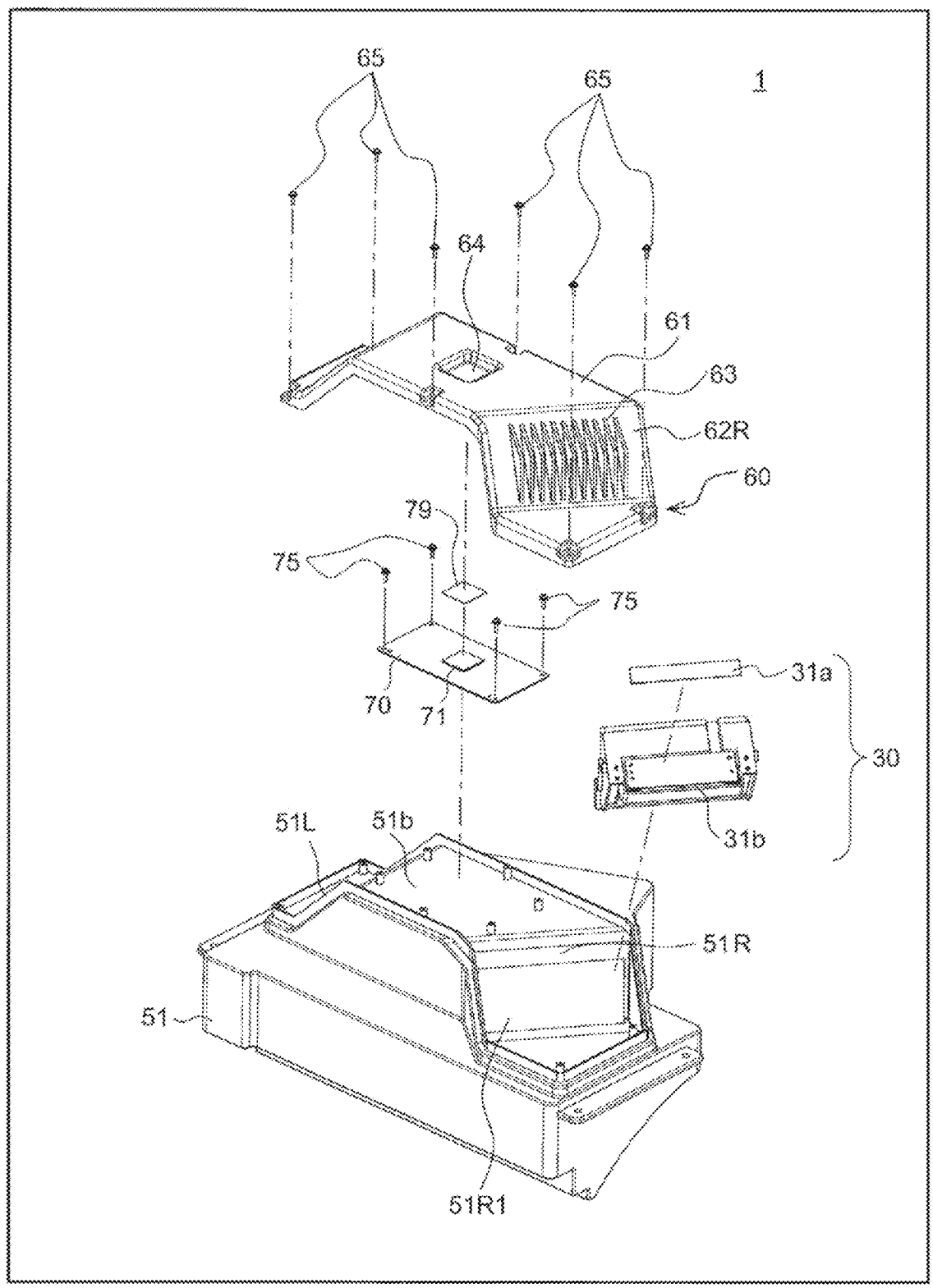
FIG. 6 explains an assembly of a bottom cover.
Figure 7:
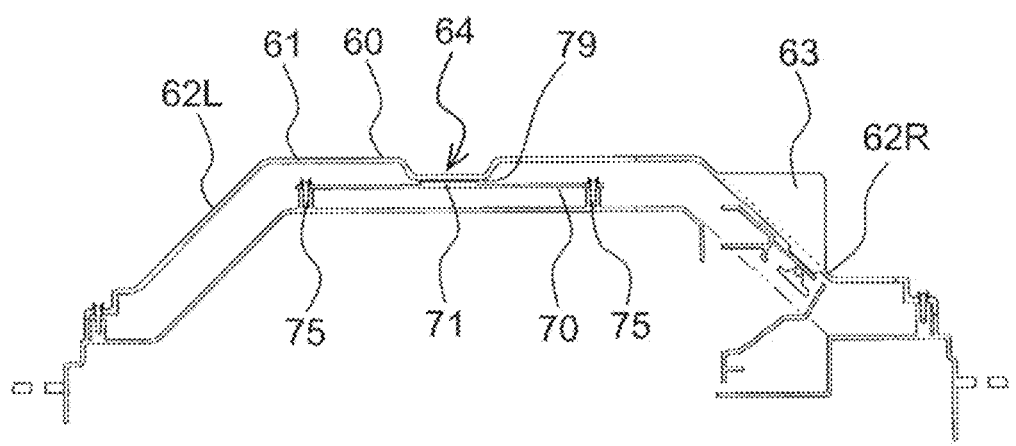
FIG. 7 is a cross-section view of an A-A' line in FIG. 4.

FIG. 3 is a perspective view of a bottom portion of the outer housing 50. FIG. 4 is a plan view of the bottom portion of the outer housing 50. FIG. 5 explains a structure of the bottom cover 60, in which a plan view (a), a perspective view (b) of an inner surface of the bottom cover 60, a perspective view (c) of the left side, a perspective view (d) of the right side, and a perspective view (e) of the appearance are related and illustrated. FIG. 6 explains an assembly of the bottom cover 60. FIG. 7 is a cross-section view of a line A-A of FIG. 4.

As illustrated in FIG. 3, FIG. 4, and FIG. 5, the outer housing 50 is formed by covering a bottom surface of the outer case 51 with the bottom cover 60. The bottom cover 60 includes a bottom plane 61, a bottom first inclined surface 62R that is inclined from one side of the bottom plane 61 (right side in FIG. 3) toward one side of the outer case 51 (right side in FIG. 3), and a bottom second inclined surface 62L that is inclined from the other side of the bottom plane 61 (left side in FIG. 3) toward the other side of the outer case 51 (left side in FIG. 3).

The bottom cover 60 is formed of a material having a thermal conductivity higher than that of air, for example, a metal material such as iron, aluminum, and copper, or a non-metal material such as ceramic.

The bottom first inclined surface 62R is provided with the fins 63 that are formed by arranging substantially triangular plate members. In addition, the bottom plane 61 includes a recess 64 that is recessed toward the inner space side of the outer case 51. Since, in order to enhance the dust proof performance, it is preferable to realize a substantially sealed state of the outer housing 50 in a state where the upper cover 52 and the bottom cover 60 are fixed to the outer case 51, none of the outer housing 50, the upper cover 52 and the bottom cover 60 is provided with an air vent. Accordingly, it is necessary to dissipate heat in the outer housing 50 to the outside of the outer housing 50. With this regard, the fins 63 and the recess 64 described above are members for improving the heat dissipation performance of the outer housing 50. Details thereof will be described later.

As illustrated in FIG. 6, a bottom of the outer case 51 is formed to protrude in the depth direction from an upper portion of the outer case 51 to which the upper cover 52 is to be attached. Specifically, the outer case 51 includes a substrate holding surface 51b that is arranged on a position farthest from the upper portion of the outer case 51 in the depth direction, a case first inclined surface 51R that is inclined from one side of the substrate holding surface 51b (right side in FIG. 6) toward one side of the outer case 51 (right side in FIG. 6), and a case second inclined surface 51L that is inclined from the other side of the substrate holding surface 51b (left side in FIG. 6) toward the other side of the outer case 51 (left side in FIG. 6).

The case first inclined surface 51R includes a mounting opening 51R1 for mounting the image display device 30. The image display device 30 includes a backlight 31a, a light guide 31b for guiding emission light of the backlight 31a to the LCD panel 31c, and the LCD panel 31c on which a display object is displayed. At the time when the light emitted from the backlight 31a passes through the LCD panel 31c, the image light including a display object image is formed, and the generated image light is emitted from the LCD panel 31c.

As the backlight 31a, for example, a Light Emitting Diode (LED) which is a relatively inexpensive and reliable solid-state light source is used. The surface emission type backlight 31a is employed in order to increase the output.

The image display device 30 is mounted by fitting the LCD panel 31c to the mounting opening 51R1 of the outer case 51. Accordingly, the image display device 30 is mounted to the outer case 51 in a state where the backlight 31a is exposed. When the outer case 51 is covered with the bottom cover 60 in the state above, an inner surface of the bottom first inclined surface 62R faces the backlight 31a. Thus, heat generated from the backlight 31a is transferred to the bottom first inclined surface 62R faster than to the other portions of the bottom cover 60. The heat of the backlight 31a transferred to the bottom first inclined surface 62R is dissipated from the fins 63 that are formed on the outer surface of the bottom first inclined surface 62R, thereby improving the heat dissipation performance.

In the HUD 1, the outer housing 50 accommodates a CPU (control circuit) 71 configured to control the mirror drive unit 44 and the image display device 30, and a main substrate 70 on which the CPU 71 is mounted. The image display device 30 is configured to display a display object on the LCD panel 31c based on an image signal received from the main substrate 70 via a flexible cable, and modulate the light from the backlight 31a so as to emit the image light.

As illustrated in FIG. 6, the main substrate 70 is fixed to the substrate holding surface 51b of the outer case 51 by screws (fastening member) 75. On the CPU 71, a heat conductive sheet 79 having a thermal conductivity higher than that of air is placed. Then, the outer case 51 is fixed to the bottom cover 60 by using screws 65.

As illustrated in FIG. 7, the recess 64 is provided on a position facing the CPU 71, thereby forming a heat transfer path extending from the CPU 71 to the bottom cover 60 via the heat conductive sheet 79.

The depth of the recess 64 is preferably the depth at which no gaps occur between a bottom surface of the recess 64 and the CPU 71 through the heat conductive sheet 79. As a result, it is possible to suppress an air layer from being formed in the heat transfer path extending from the CPU 71 to the bottom cover 60 via the heat conductive sheet 79, thereby further improving the thermal conductivity.

According to the HUD 1 of the present embodiment, none of the upper cover 52, the outer case 51, and the bottom cover 60 has an opening such as an air vent. The outer housing 50 is sealed in a state where these are assembled so that its dustproof performance can be improved. The sealing mentioned herein does not necessarily require strict sealability, but means that the bottom surface of the outer case 51 and the image display device 30 are accommodated while being isolated from the external space of the outer housing 50 in a state where the bottom cover 60 is fixed to the outer case 51 by using the screws 75. Although high sealability is preferable, it is not intended to require, for example, interposing a packing between the outer case 51 and the bottom cover 60 to secure the sealability.

On the other hand, reducing the size of the HUD 1 narrows the inner space thereof, and accordingly, it is forced to arrange the backlight 31a that is a heat source close to the CPU 71 that requires countermeasures for heat generation. Considering the sealability of the outer housing 50, it is necessary to make countermeasures to the heat generated from the CPU 71.

With this regard, since the fins 63 are provided on the outer surface of the portion of the bottom cover 60 which faces the backlight 31a, the heat generated from the backlight 31a can be dissipated quickly from the fins 63 of the bottom cover 60. As a result, it is possible to suppress heat accumulation in the outer housing 50.

Furthermore, the heat generated from the CPU 71 itself can be also transferred to the bottom cover 60 via the heat conductive sheet 79. As a result, it is possible to further suppress heat accumulation in the outer housing 50, and suppress rise in the temperature of the CPU 71.

Furthermore, the fins 63 integrally molded with the bottom cover 60 function as a rib structure of the bottom cover 60. As a result, it is possible to increase the strength of the bottom cover 60.

The present invention is not limited to the embodiment described above, and various modifications without departing from the concept of the invention belong to the technical scope of the present invention.

Figure 8:
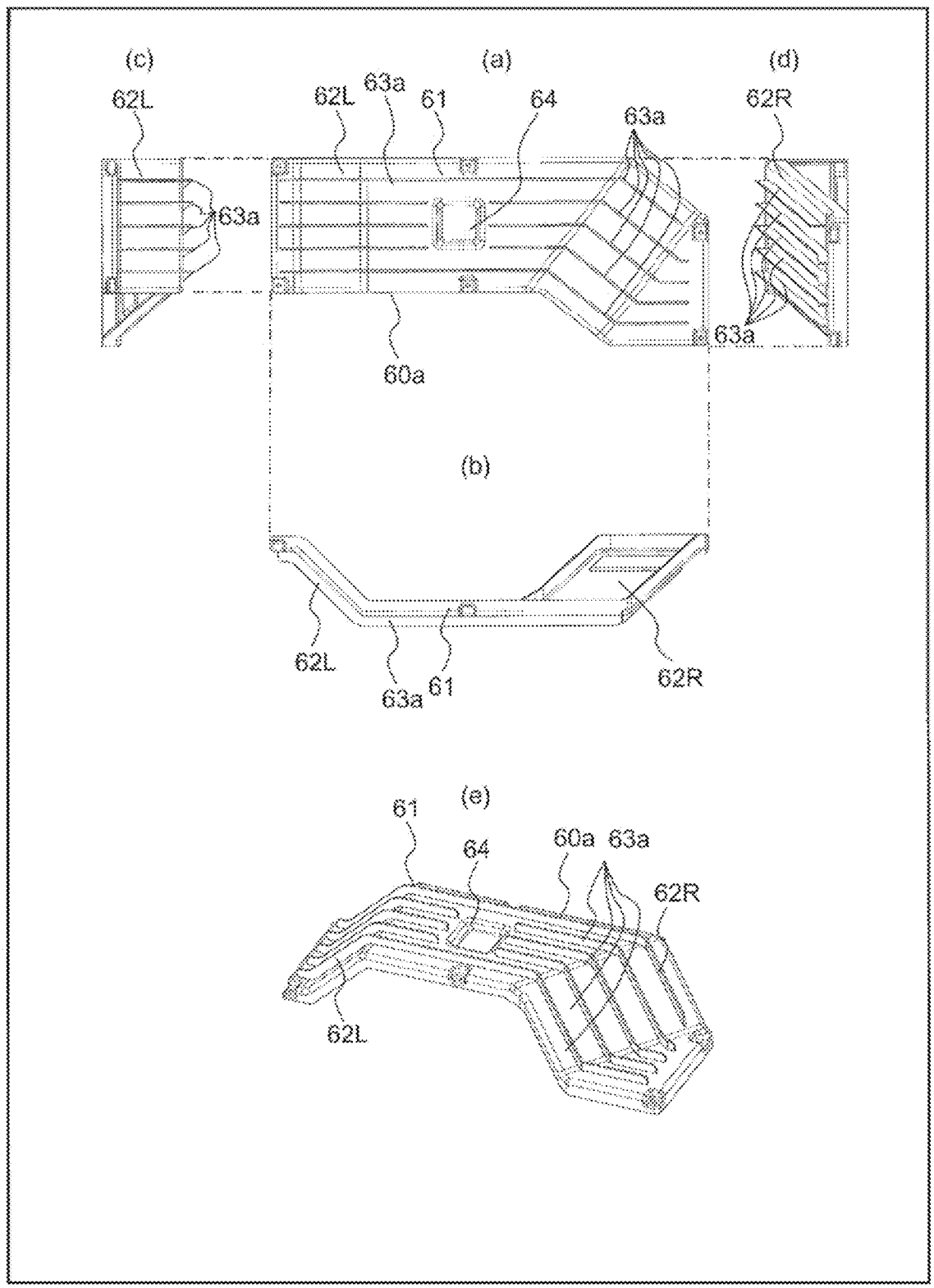
FIG. 8 explains a structure of a bottom cover (one of other examples).
Figure 9:
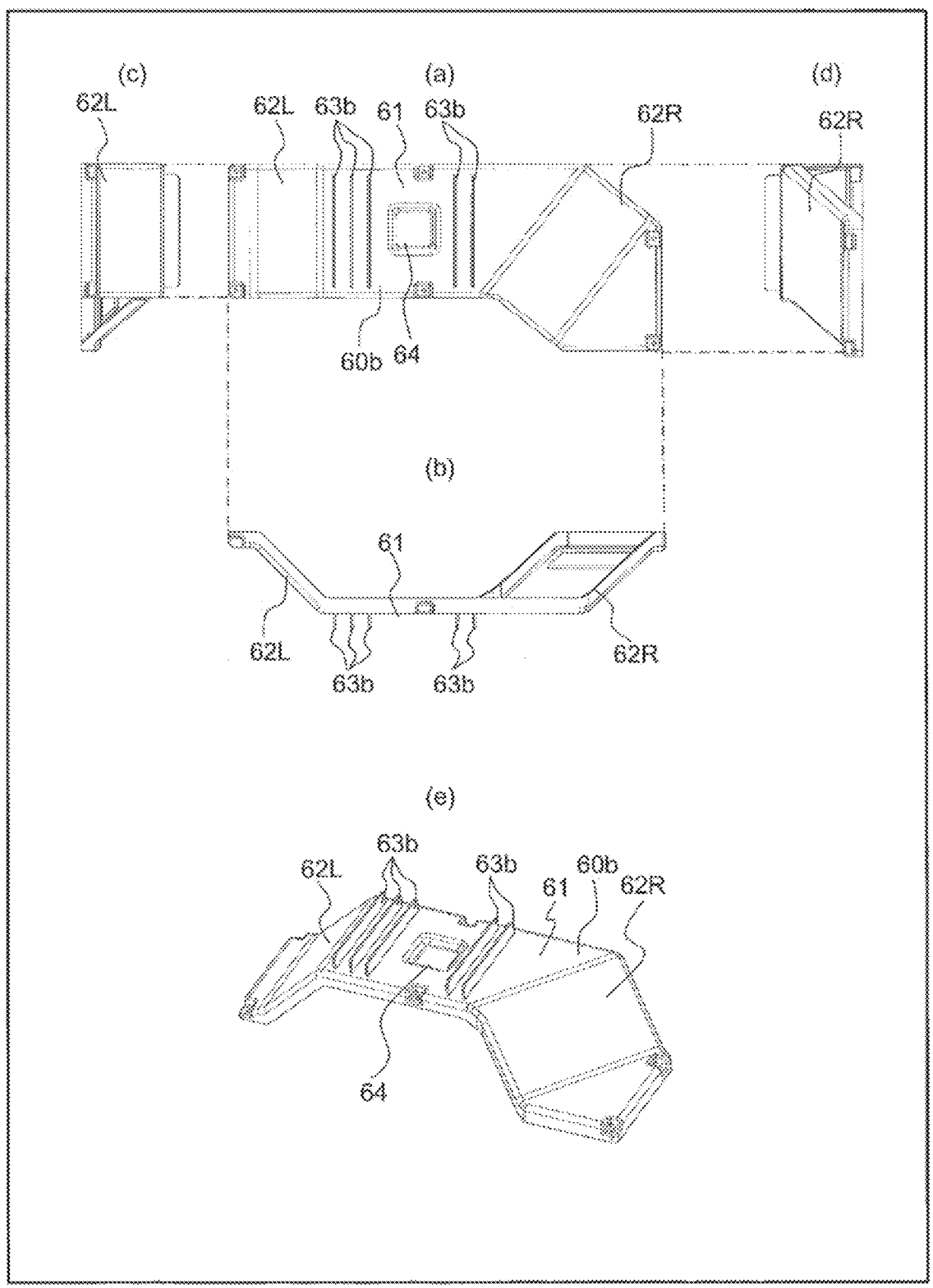
FIG. 9 explains a structure of a bottom cover (one of other examples).
Figure 10:
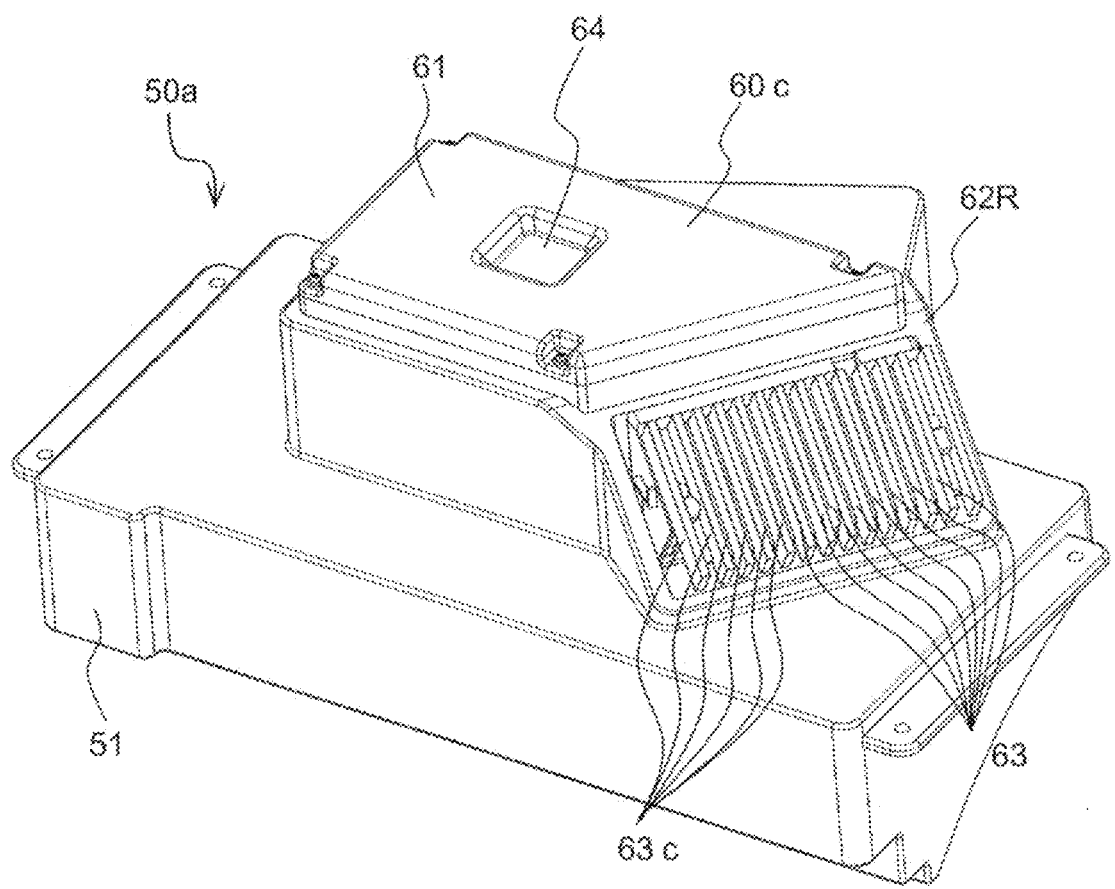
FIG. 10 explains a structure of a bottom cover (one of other examples).

With reference to FIG. 8 and FIG. 9, other embodiments will be described. Each of FIG. 8 and FIG. 9 explain a structure of each bottom cover 60a, 60b, in which a plan view (a), a perspective view (b) of the inner surface of the bottom cover 60, a perspective view (c) of the left side, a perspective view (d) of the right side, and a perspective view (e) of the appearance are related and illustrated. FIG. 10 is a perspective view of the appearance of the bottom cover 60c.

Comparing the bottom cover 60a illustrated in FIG. 8 with the bottom cover 60 described above, the shapes of the fins 63a are different from those of the fins 63. The bottom cover 60a is provided with the fins 63a that are formed by arranging a plurality of projections consecutively along the bottom first inclined surface 62R, the bottom plane 61, and the bottom second inclined surface 62L. Since the fins 63a provided over the longitudinal direction of the bottom cover 60a form a rib structure, it is possible to increase the strength of the bottom cover 60a. Furthermore, since the surface area of the fins 63a is larger than that of the fins 63 of the bottom cover 60, it is possible to improve the heat dissipation performance.

Comparing the bottom cover 60b illustrated in FIG. 9 with the bottom cover 60 described above, the shapes and arrangement positions of the fins 63b are different from those of the fins 63. The bottom cover 60b is provided with the fins 63b that are formed by arranging a plurality of rows of projections substantially parallel to the width direction of the bottom plane 61. There may be a case where, depending on the shape of the inside of the dashboard to which the HUD 1 is mounted, fins cannot be formed on an outer surface of an opposing surface (for example, the bottom first inclined surface 62R) of the backlight 31*a*. In such a case, fins may be provided on other positions of the bottom cover 60*b*.

On a bottom cover 60*c* illustrated in FIG. 10, the bottom plane 61 and the bottom first inclined surface 62R are consecutively formed, but the bottom second inclined surface 62L provided on the bottom cover 60 described above is not formed. Then, fins 63*c* are provided by arranging a plurality of rows of plate members on the bottom first inclined surface 62R. As a result, it is possible to reduce the weight of the bottom cover 60*c* than that of a cover including the bottom second inclined surface 62L.

REFERENCE SIGNS LIST

1: HUD
2: vehicle
3: wind shield
5: driver
30: image display device
31*a*: backlight
31*b*: light guide
31*c*: LCD panel
40: virtual image optical system
41: lens unit
42: reflecting mirror
43: concave mirror
44: mirror drive unit
50: outer housing
51: outer case
51L: case second inclined surface
51R: case first inclined surface
51R1: mounting opening
51*b*: substrate holding surface
52: upper cover
52*a*: emission opening
53: antiglare plate
60: bottom cover
60*a*: bottom cover
60*b*: bottom cover
60*c*: bottom cover
61: bottom plane
62L: bottom second inclined surface
62R: bottom first inclined surface
63: fin
63*a*: fin
63*b*: fin
64: recess
65: screw
70: main substrate
71: CPU
75: screw
79: heat conductive sheet
80: virtual image
L: optical path

The invention claimed is:

1. A vehicle for displaying a virtual image to a driver, the vehicle comprising:
    a windshield;
    an image display device that includes a backlight and a liquid crystal panel;
    a virtual image optical system that forms an optical path of an image light emitted from the liquid crystal panel by being reflected by the windshield or a projecting target; and
    an outer housing that accommodates the image display device and the virtual image optical system, wherein the outer housing includes:
    an outer case, to which the image display device is to be mounted, that accommodates the virtual image optical system;
    an upper cover that covers an upper portion, through which the image light is emitted, of the outer case;
    a bottom cover that covers a bottom portion of the outer case,
    wherein the bottom cover includes:
    in a state of being fixed to the outer case, accommodate a bottom surface of the outer case and the image display device to isolate the bottom surface of the outer case and the image display device from an external space of the outer housing; and
    fins on an outer surface thereof;
    a control circuit configured to control the image display device; and
    a main substrate equipped with the control circuit, wherein
    the outer case includes, on a surface facing the bottom cover, a substrate holding surface for holding the main substrate, and
    a heat conductive portion having a thermal conductivity higher than that of air is between the control circuit on the main substrate held by the substrate holding surface and the bottom cover.

2. The vehicle according to claim 1, wherein a recess that is recessed toward the control circuit is on a surface, which faces the control circuit, of the bottom cover.

3. The vehicle according to claim 2, wherein the recess extends to the control circuit.

4. The vehicle according to claim 1, wherein the bottom cover includes an inclined surface that extends from a surface, which faces the control circuit, of the bottom cover towards a first side of the outer case.

5. The vehicle according to claim 4, wherein the fins are on the inclined surface.

6. The vehicle according to claim 1, wherein the heat conductive portion is between a surface of the bottom cover, which faces the control circuit, and the main substrate.

7. The vehicle according to claim 1, wherein the fins are triangular plates.

8. A vehicle for displaying a virtual image to a driver, the vehicle comprising:
    a windshield;
    an image display device that includes a backlight and a liquid crystal panel;
    a virtual image optical system that forms an optical path of an image light emitted from the liquid crystal panel by being reflected by the windshield or a projecting target; and
    an outer housing that accommodates the image display device and the virtual image optical system, wherein the outer housing includes:
    an outer case, to which the image display device is to be mounted, that accommodates the virtual image optical system;
    an upper cover that covers an upper portion, through which the image light is emitted, of the outer case;
    a bottom cover that covers a bottom portion of the outer case, the bottom cover including
    in a state of being fixed to the outer case, accommodate a bottom surface of the outer case and the image display device so as to isolate the bottom surface of the outer case and the image display device from an external space of the outer housing; and fins on an outer surface thereof, wherein the image display device is mounted to the outer case in a manner that the liquid crystal panel is exposed to an inner space of the outer case and the backlight is exposed to an outside of the outer case, and the fins are formed on an outer surface of a surface, which faces the backlight, of the bottom cover;

a control circuit configured to control the image display device; and a main substrate equipped with the control circuit, wherein the outer case includes, on a surface facing the bottom cover, a substrate holding surface for holding the main substrate, and a heat conductive portion having a thermal conductivity higher than that of air between the control circuit on the main substrate held by the substrate holding surface and the bottom cover.

9. The vehicle according to claim 8, wherein a recess that is recessed toward the control circuit is formed on a surface, which faces the control circuit, of the bottom cover.

10. The vehicle according to claim 9, wherein the recess extends to the control circuit.

11. A vehicle for displaying a virtual image to a driver, the vehicle comprising:

a windshield;

a display panel;

a virtual image optical system that forms a virtual image based on an image light emitted from the display panel by being reflected by the windshield or a projecting target;

an outer housing that accommodates the display panel and the virtual image optical system, wherein the outer housing includes:

an outer case, to which the display panel is to be mounted;

a first cover including an opening through which the image light is emitted; and a second cover, wherein the second cover includes fins on an outer surface thereof;

a control circuit configured to control the display panel and a main substrate equipped with the control circuit;

a substrate holding surface for holding the main substrate on a surface facing the second cover; and a heat conductive portion having a thermal conductivity higher than that of air between the control circuit on the main substrate held by the substrate holding surface and the second cover.

12. The vehicle according to claim 11, wherein the heat conductive portion is between a surface of the second cover, which faces the control circuit, and the main substrate.

13. The vehicle according to claim 11, further comprising a backlight for the display panel, wherein the display panel is exposed to an inner space of the outer case, the backlight is exposed to an outside of the outer case, and the fins are on an outer surface of a surface, which faces the backlight, of the second cover.

14. The vehicle according to claim 11, wherein a recess that is recessed toward the control circuit is on a surface, which faces the control circuit, of the second cover.

15. The vehicle according to claim 14, wherein the recess extends to the control circuit.

16. The vehicle according to claim 11, wherein the second cover includes an inclined surface that extends from a surface, which faces the control circuit, of the second cover towards the outer case.

17. The vehicle according to claim 16, the fins are on the inclined surface.

18. The vehicle according to claim 11, wherein the fins are triangular plates.

19. The vehicle according to claim 11, wherein the second cover includes a first inclined surface that extends from a surface, which faces the control circuit, of the second cover towards a first side of the outer case and a second inclined surface that extends from the surface, which faces the control circuit, of the second cover towards a second side of the outer case.

* * * * *